(12) United States Patent
Murphy et al.

(10) Patent No.: US 11,593,002 B2
(45) Date of Patent: *Feb. 28, 2023

(54) ARTIFICIAL NEURAL NETWORKS IN MEMORY

(71) Applicant: Micron Technology, Inc., Boise, ID (US)

(72) Inventors: Richard C. Murphy, Boise, ID (US); Glen E. Hush, Boise, ID (US); Honglin Sun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/317,048

(22) Filed: May 11, 2021

(65) Prior Publication Data

US 2021/0278980 A1 Sep. 9, 2021

Related U.S. Application Data

(63) Continuation of application No. 16/538,146, filed on Aug. 12, 2019, now Pat. No. 11,054,997.

(51) Int. Cl.
 *G06F 3/06* (2006.01)
 *G06N 3/04* (2023.01)
(52) U.S. Cl.
 CPC .......... *G06F 3/0629* (2013.01); *G06F 3/0604* (2013.01); *G06F 3/0673* (2013.01); *G06N 3/04* (2013.01)

(58) Field of Classification Search
 CPC .... G06F 3/0629; G06F 3/0604; G06F 3/0673; G06N 3/04; G06N 3/063; G06N 3/08; G06N 3/0454; G06N 20/00; G11C 8/08
 See application file for complete search history.

(56) References Cited

U.S. PATENT DOCUMENTS 5,050,095 A 9/1991 Samad
5,075,868 A 12/1991 Andes et al.
(Continued)

FOREIGN PATENT DOCUMENTS

KR 10-2019-0016311 A 2/2019

OTHER PUBLICATIONS

Tomasz Talaska, "Components of Artificial Neural Networks Realized in CMOS Technology to be Used in Intelligent Sensors in Wireless Sensor Networks", Sensors 2018, vol. 18, Issue 12, Dec. 19, 2018, 19 pages.
(Continued)

*Primary Examiner* — Hiep T Nguyen
(74) *Attorney, Agent, or Firm* — Brooks, Cameron & Huebsch, PLLC

(57) ABSTRACT

Systems, apparatuses, and methods related to multiple artificial neural networks (ANNs) in memory. Such ANNs can be implemented within a memory system (including a number of memory devices) at different granularities. For example, multiple ANNs can be implemented within a single memory device and/or a single ANN can be implemented over multiple memory devices (such that multiple memory devices are configured as a single ANN). The memory system having multiple ANNs can operate each ANN independently from each other such that multiple ANN operations can be concurrently performed.

20 Claims, 6 Drawing Sheets

(56) References Cited

U.S. PATENT DOCUMENTS

| | | | |
|---|---|---|---|
| 7,043,466 B2 | 5/2006 | Watanabe et al. | |
| 9,430,735 B1 | 8/2016 | Vali et al. | |
| 10,360,971 B1 | 7/2019 | Hokenmaier et al. | |
| 10,461,076 B1 | 10/2019 | Brewer | |
| 11,054,997 B2 * | 7/2021 | Murphy | G06F 3/0604 |
| 2004/0073764 A1 | 4/2004 | Andreasson | |
| 2010/0241601 A1 | 9/2010 | Carson et al. | |
| 2016/0343452 A1 * | 11/2016 | Ikeda | H01L 27/1255 |
| 2019/0034788 A1 | 1/2019 | Burr | |
| 2019/0042917 A1 | 2/2019 | Gurwicz et al. | |
| 2019/0236441 A1 | 8/2019 | Shifren et al. | |
| 2020/0257986 A1 | 8/2020 | Diamantopoulos et al. | |
| 2021/0097388 A1 * | 4/2021 | Hinterstoisser | G06F 30/331 |

OTHER PUBLICATIONS

International Search Report and Written Opinion from related International Application No. PCT/US2020/036299, dated Sep. 11, 2020, 12 pages.

\* cited by examiner

ARTIFICIAL NEURAL NETWORKS IN MEMORY

PRIORITY INFORMATION

This application is a Continuation of U.S. application Ser. No. 16/538,146, filed Aug. 12, 2019, the contents of which are incorporated herein by reference.

TECHNICAL FIELD

The present disclosure relates generally to memory, and more particularly to apparatuses and methods associated with artificial neural networks in memory.

BACKGROUND

Memory systems may be implemented in electronic systems, such as computers, cell phones, hand-held electronic devices, etc. Some memory systems, such as solid state drives (SSDs), embedded Multi-Media Controller (eMMC) devices, Universal Flash Storage (UFS) devices, and the like, may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), 3D XPoint™, resistive random access memory (RRAM), ferroelectric random access memory (FeRAM), magnetoresistive random access memory (MRAM), and programmable conductive memory, among other types of memory.

Artificial neural networks (ANNs) are networks that can process information by modeling a network of neurons, such as neurons in a human brain, to process information (e.g., stimuli) that has been sensed in a particular environment. Similar to a human brain, neural networks typically include a multiple neuron topology (e.g., that can be referred to as artificial neurons).

DETAILED DESCRIPTION

Figure 1:
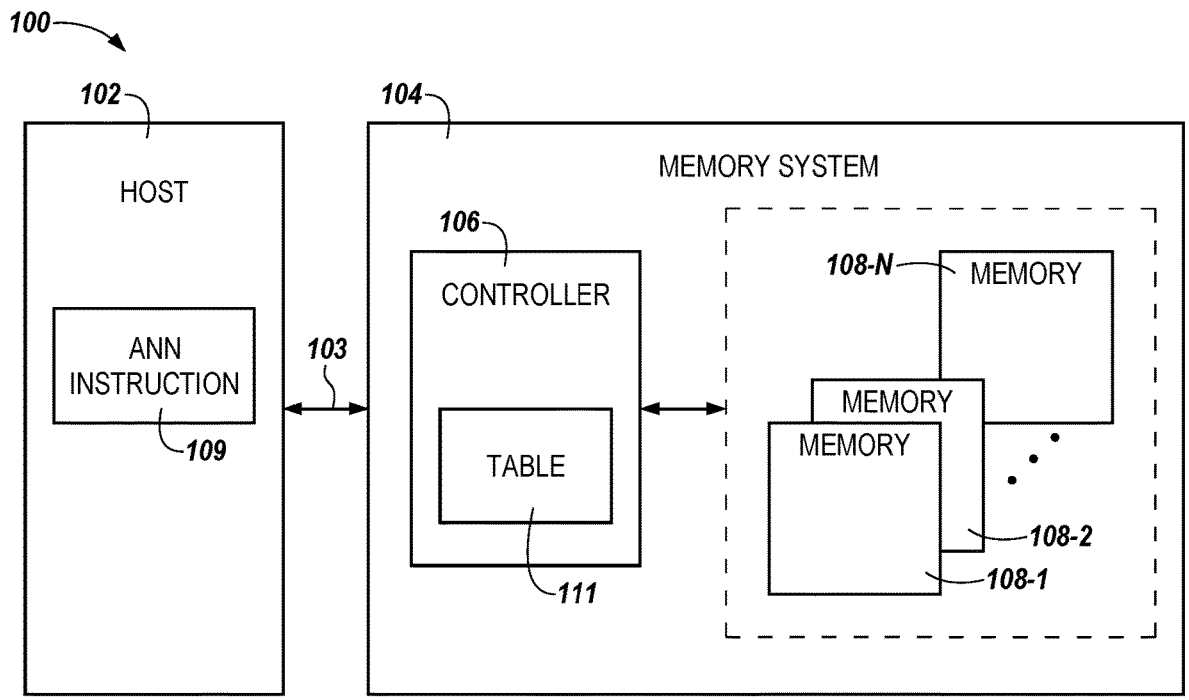
FIG. 1 is a block diagram of an apparatus in the form of a computing system including a host and a memory system in accordance with a number of embodiments of the present disclosure.

Apparatuses and methods disclosed herein are related to multiple artificial neural networks (ANNs) in memory. A method may include configuring a first portion of a memory device as a first ANN and configuring a second portion of the memory device as a second ANN. The memory device may include a plurality of logic blocks in complimentary metal-oxide-semiconductor (CMOS) under an array of memory cells and the first portion and the second portion of the memory device each comprise at least one of the plurality of logic blocks.

A number of embodiments described herein provide benefits, such as eliminating a need to have multiple memory systems for operating multiple ANNs. For example, the present disclosure can implement multiple ANNs within a single memory system, which can perform multiple ANN operations (e.g., by operating multiple ANNs) concurrently within the same memory system. Accordingly, multiple ANNs implemented within a single memory system can reduce a cost and time associated with operating multiple ANNs.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a host 102 and a memory system 104 in accordance with a number of embodiments of the present disclosure. As used herein, an "apparatus" can refer to, but is not limited to, a variety of structures or combinations of structures. For instance, host 102 and memory system 104 might also be separately considered an "apparatus."

In this example, the computing system 100 includes a host 102 coupled to memory system 104 via an interface 103. The host 102 can be a personal laptop computer, a desktop computer, a digital camera, a mobile telephone, a memory card reader, or an Internet-of-Things (IoT) enabled device, among various other types of systems. The host 102 can include a number of processing resources (e.g., one or more processors, microprocessors, or some other type of controlling circuitry) capable of accessing memory system 104. The host 102 can include a system motherboard and/or backplane and can include a number of processing resources (e.g., one or more processors, microprocessors, or some other type of controlling circuitry).

The system 100 can include separate integrated circuits or both the host 102 and the memory system 104 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

The host 102 can include instructions that can be provided to memory system 104 via interface 103. As an example, the instructions can include ANN instructions 109 that can enable, when provided to memory system 104, memory system 104 to perform various ANN operations using ANNs distributed over a number of memory devices 108-1, . . . 108-N.

The interface 103 coupling host 102 to memory system 104 can include, for example, a physical interface employing a suitable protocol (e.g., a data bus, an address bus, and a command bus, or a combined data/address/command bus). Such protocol may be custom or proprietary, or the interface 103 may employ a standardized protocol, such as Peripheral Component Interconnect Express (PCIe), Compute Express Link (CXL), Gen-Z, CCIX, or the like.

The memory system 104 includes controller 106 and a number of memory devices 108-1, 108-2, . . . 108-N (collectively referred to as memory devices 108). The controller 106 can comprise a state machine, a sequencer, and/or some other type of control circuitry, and include hardware and/or firmware (e.g., microcode instructions) in the form of an application specific integrated circuit (ASIC), field programmable gate array, etc. The controller 106 can be located local to each of the memory devices 108. Stated differently, although one controller 106 is illustrated in FIG. 1, the memory system 104 can include a plurality of controller each being located local to respective memory devices 108.

The memory devices 108 can comprise memory cells arranged in rows coupled by access lines (which may be referred to herein as word lines or select lines) and columns coupled by sense lines (which may be referred to herein as digit lines or data lines). The array of memory cells can include, but not limited to, DRAM array, SRAM array, STT RAM array, PCRAM array, TRAM array, RRAM array, NAND flash array, and/or NOR flash array, for instance. The memory devices 108 can be in the form of a plurality of individual memory die and/or distinct memory layers formed as integrated circuits on a chip.

In various embodiments, the memory devices 108 can be three-dimensional (3D) and can include multiple layers stacked together. As an example, each of the memory devices 108 can include a first layer including a logic component (e.g., logic blocks, row drivers, and/or column drivers), and a second layer stacked on the first layer and including a memory component such as an array or memory cells.

Although not shown in FIG. 1, the memory system 104 can also include a decoder (e.g., row/column decoders) that can be controlled by the controller 106 to decode address signals received from the host 102, for instance. The decoded address signals can be further provided, via the controller 106, to row/column drivers, which can activate row/columns of an array of memory cells of the memory devices 108.

The controller 106 can map physical locations (e.g., addresses) of respective logics (e.g., logic 422 as described in connection with FIG. 4) and/or memory cells of memory devices 108 to respective logical addresses and store the mapping information in a lookup table 111. Using the lookup table 111, the controller 106 can access, accordingly, logics 422 and/or memory cells of the memory devices 108 and/or track a topology of ANNs implemented within the memory devices 108 by using the mapping information stored in the lookup table 111.

In a number of embodiments, the controller 106 can configure various portions of the memory devices 108 as multiple ANNs and perform, in response to receiving ANN instructions 109, respective ANN operations using the memory devices 108 configured as ANNs. As used herein, the term "configuring" refers to designating a group of elements as elements of the same network. For example, a particular set of logic blocks can be configured as an ANN, such that the particular set of logic blocks are utilized for performing an operation (e.g., ANN operation) requested to be performed via the ANN. As used herein, an ANN operation refers to an operation that performs, to process a given task, process inputs using artificial neurons. In some embodiments, the ANN operation involves performing various machine learning algorithms to process the inputs. Example tasks that can be processed by performing ANN operations can include computer vision, speech recognition, machine translation, social network filtering, and/or medical diagnosis.

Figure 3:
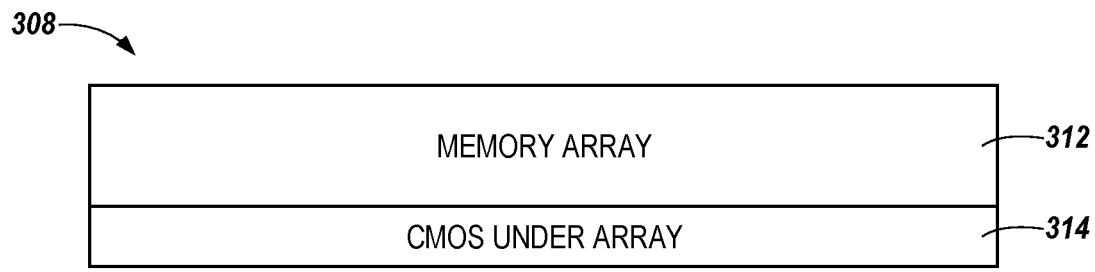
FIG. 3 is a block diagram of an example memory device including a plurality of layers in accordance with a number of embodiments of the present disclosure.

ANNs can be implemented within memory device 108 at various granularities. In an example in which each memory device includes a plurality of logic blocks (e.g., logic block 316 as illustrated in FIG. 3), an ANN can be implemented within a single logic block, and/or over multiple logic blocks and/or memory devices (e.g., memory devices 108). Each ANN implemented within memory device 108 can be operated independently from each other such that, for example, a number of ANN operations can be performed concurrently.

Figure 2:
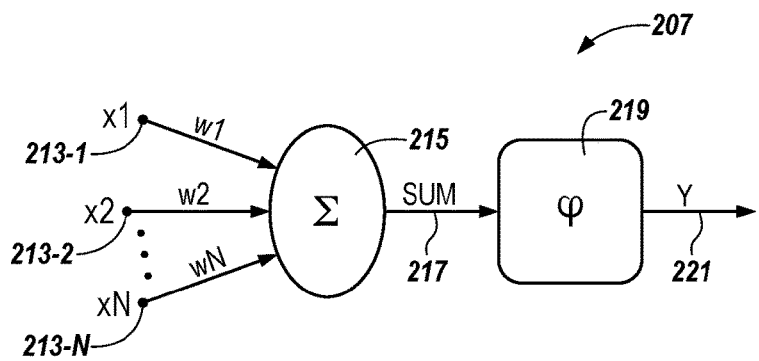
FIG. 2 illustrates an example of an artificial neuron in accordance with a number of embodiments of the present disclosure.

FIG. 2 illustrates an example of an artificial neuron 207 that can be used to mimic a biological neuron (e.g., of a human brain) in accordance with a number of embodiments of the present disclosure. Such neurons can sometimes be referred to as perceptrons. A number of inputs x1 to xN, which can be referred to as stimuli, can be respectively applied to inputs 213-1 to 213-N of neuron 207. Signals, such as voltages, currents, or particular data values (e.g., binary digits), corresponding to inputs x1 to xN can be generated responsive to sensing some form of stimuli and can be applied inputs 213-1 to 213-N.

In various instances, the inputs x1 to xN can be respectively weighted by the weights w1 to wN that can be referred to as synaptic weights. For example, inputs x1 to xN can be respectively multiplied by the weights w1 to wN to respectively weight inputs x1 to xN. For example, each weighted input can be referred to as a synapse, and the weight can correspond to a memory in human brain behavior.

Neuron 207 can include a summation function 215 that can perform an addition operation on the weighted inputs to produce an output 217, such as SUM=x1*w*1+x2*w*2+ . . . +xN*w*N. In neural network theory, for example, "SUM" can be referred to as "NET" (e.g., from the term "NETwork"). For example, the weighted signals corresponding to weighted inputs x1w1 to xNwN can be summed. In some examples, the summation function can be referred to as a transfer function. Neuron 207 further includes a function 219, such as a function φ, configured to respond to the summation SUM and to generate an output value Y at an output 221. In some examples, function 219 can be referred to as an activation function. Outputs of neurons can sometimes be referred to as classes.

Various functions can be utilized for the function 219. For example, function 219 can include a threshold function (e.g., a step function) to determine if SUM is above or below a particular threshold level. Such a threshold function might generate a logic high output (e.g., a logical 1) on the output 221 if SUM is greater than or equal to the particular threshold amount and might generate a logic low (e.g., a logical 0) on the output 221 if SUM is below the particular threshold amount.

In some examples, function 219 can be a sigmoid function, wherein the sigmoid function might be expressed as $S(z)=1/(1+e^{\lambda z})$, in which $\lambda$ is a constant and z can be SUM. For example, function 219 can be a non-linear function. In some examples, the generated output value Y at the output 221 can be applied to a number of additional neurons, such as to inputs 213 of different neurons, of a neural network of neurons. The function 219 can further include a sign function and/or linear function, among others.

FIG. 3 is a block diagram of an example memory device 308 including a plurality of layers in accordance with a number of embodiments of the present disclosure. The memory device 308 can be analogous to memory device 108 previously described in connection with FIG. 1.

As illustrated in FIG. 1, the memory device 308 is a 3D memory device including multiple layers stacked together. As an example, a first layer 312 (e.g., memory array as illustrated in FIG. 3) of the memory device 308 is stacked on a second layer 314 (e.g., CMOS under array as illustrated in FIG. 3) of the memory device 308. The first layer 312 of the memory device 308 can include an array of memory cells. Although embodiments are not so limited, memory cells of the array can include DRAM memory cells.

The second layer 314 can include a number of logic blocks that are configured to perform various functions, for example, using data values stored in the array of memory cells. As further illustrated in connection with FIG. 4, each logic block can include also row/column drivers.

Figure 4:
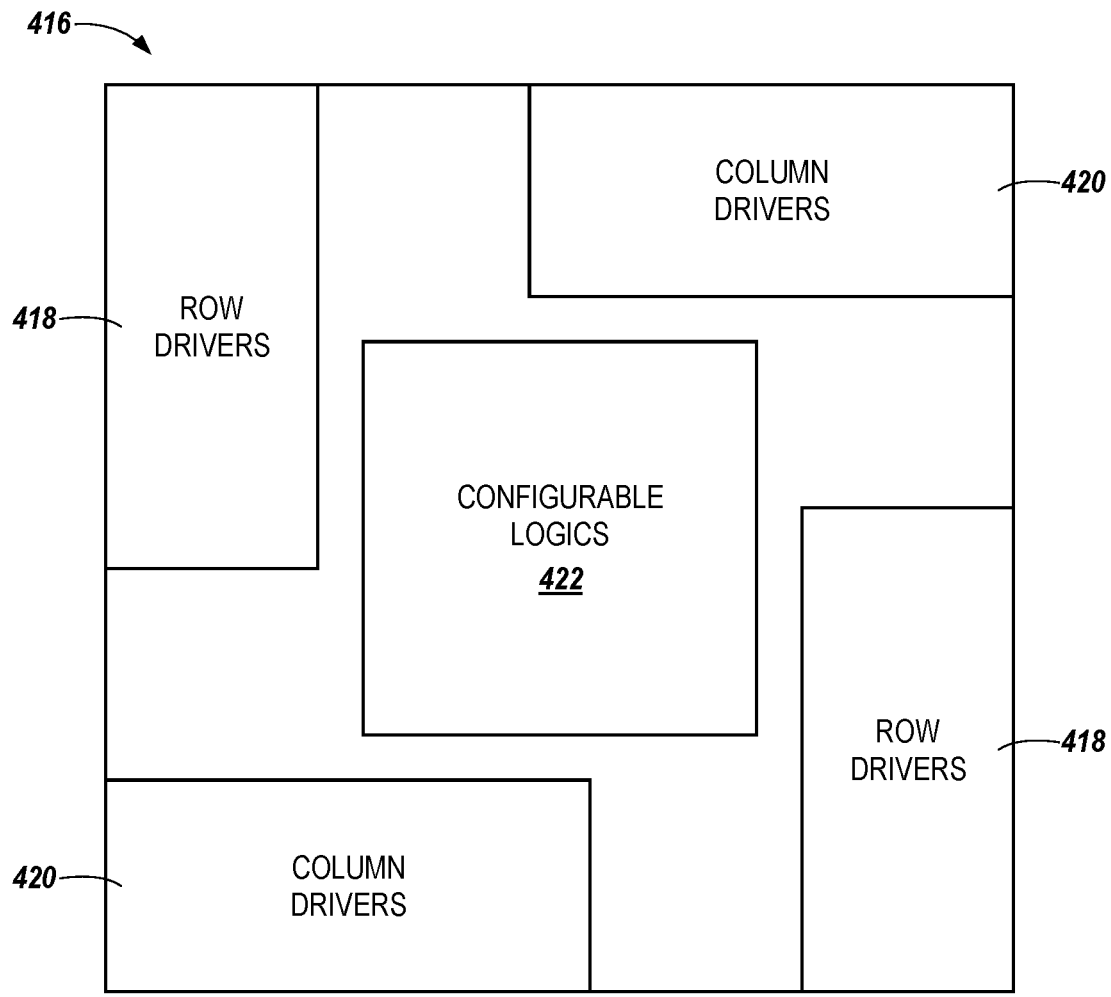
FIG. 4 is a block diagram of an example logic block of a memory device in accordance with a number of embodiments of the present disclosure.

FIG. 4 is a block diagram of an example logic block 416 of a memory device in accordance with a number of embodiments of the present disclosure. As described in connection with FIG. 3, the logic block 416 may be one of a plurality of logic blocks included within a memory device such as memory device 108 and/or 308 as previously described in connection with FIGS. 1 and 3, respectively.

A logic block can be a configurable logic block (CLB) that is a fundamental building block of a field programmable gate array (FPGA). A FPGA refers to a chip having an ability to change its data paths and/or be reprogrammed while in the field. With such an ability, the FPGA can flexibly switch between, for example, central processing unit (CPU) and graphics processing unit (GPU). As an example, the FPGA that has been functioning as a microprocessor can be reprogrammed, while in the field, to function as a graphic card and/or an encryption unit.

As illustrated in FIG. 4, the logic block 416 includes a logic 422. The logic 422 can be a LUT-based logic. As an example, a physical location (e.g., address) of the logic 422 can be mapped to a logical address and the mapping information can be stored in a lookup table such as lookup table 111.

The logic block 416 can further include row drivers 418, and column drivers 420 that can be enabled to activate a row (or rows) and/or a column (or columns) of a memory array (e.g., memory array 312 previously described in connection with FIG. 3). As described herein, row drivers 418 and column drivers 420 can receive address signals decoded by respective row decoders and column decoders that are controllable by a controller such as controller 106 previously described in connection with FIG. 1. Although not shown in FIG. 4, the logic block 416 can also include (e.g., be coupled to) a plurality of data buses coupling logic block 416 to another logic block and/or another external device (e.g., device located external to memory device 308). A data bus of the logic block 416 that couples the logic block 416 to another logic block can include an interconnect fiber, as further described below.

Figure 5:
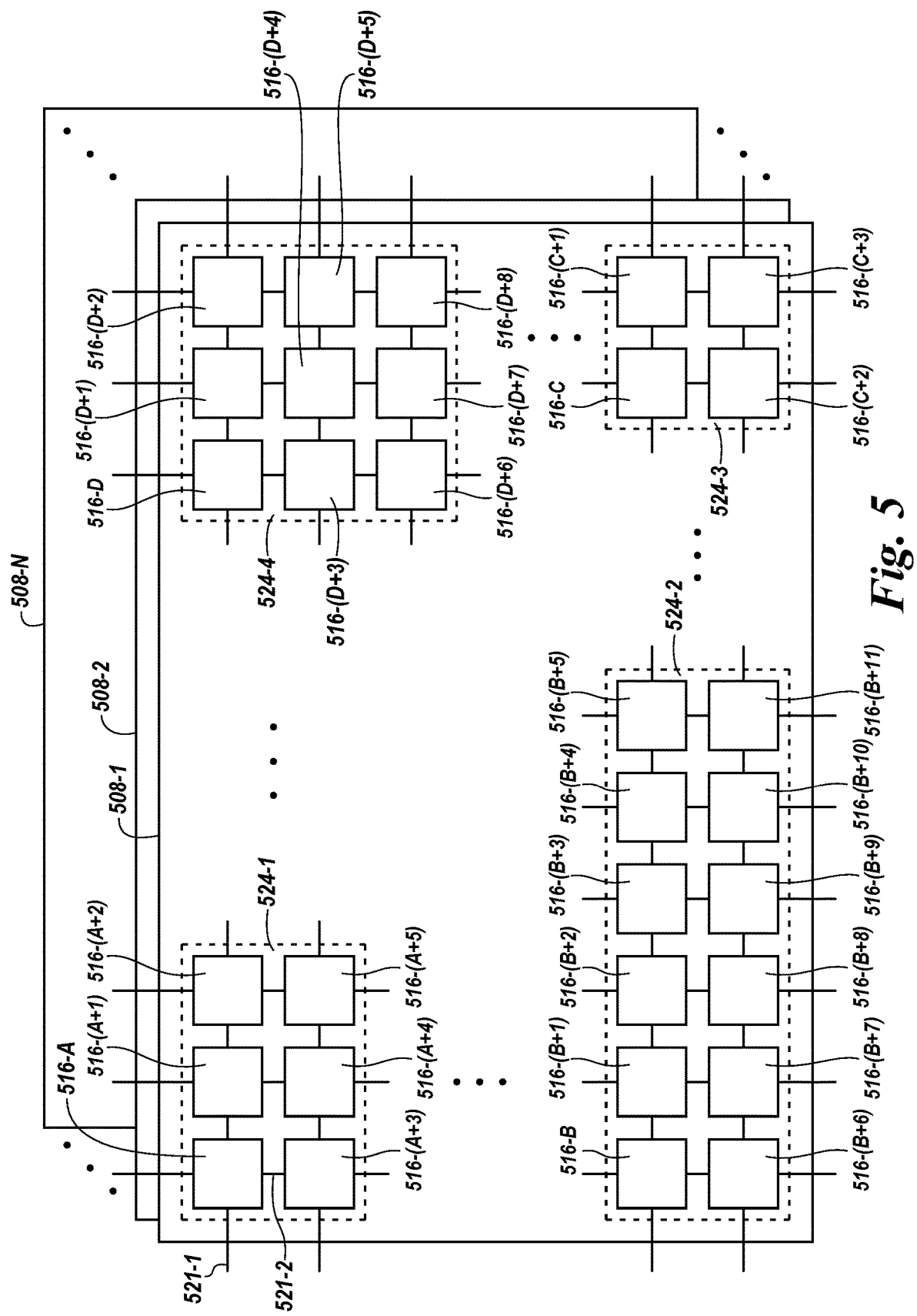
FIG. 5 is a block diagram of a number of memory devices and a number of logic blocks included within respective memory devices in which multiple artificial neural networks are implemented in accordance with a number of embodiments of the present disclosure.

FIG. 5 is a block diagram of a number of memory devices 508-1, 508-2, . . . 508-N and a number of logic blocks 516 included within respective memory devices in which multiple artificial neural networks are implemented in accordance with a number of embodiments of the present disclosure. The number of memory devices 508-1, 508-2, . . . 508-N (collectively referred to as memory devices 508) can be analogous to memory devices 108 and/or 308 as previously described in connection with FIGS. 1 and 3, respectively. As described herein, each memory device 508 can be in the form of an individual memory die such as a DRAM memory die.

As illustrated in FIG. 5, each logic block can include a data bus coupling a logic block to another logic block and/or another device (e.g., device located external to the memory device (e.g., memory device 508-1)). For example, a data bus 521-1 coupled to a logic block 516-A and extending beyond the memory device 508-1 is an example data bus (e.g., I/O boundary) enabling a data communication between the memory device 508-1 and another device located external to the memory device 508-1. For example, the memory device 508-1 can communicate with a host (e.g., host 102 as illustrated in FIG. 1) via a data bus, such as the data bus 521-1. For example, a data bus 521-2 (e.g., interconnect fiber) coupling the logic block 516-A to 516-(A+3) is an example data bus enabling an inter-block data path among logic blocks, such as between logic blocks 516-A and 516-(A+3).

As illustrated in FIG. 5, multiple ANNs are implemented within memory device 508-1. As an example, a first set of logic blocks 516-A, 516-(A+1), 516-(A+2), 516-(A+3), 516-(A+4), and 516-(A+5) are configured as a first ANN 524-1; a second set of logic blocks 516-B, 516-(B+1), 516-(B+2), 516-(B+3), 516-(B+4), 516-(B+5), 516-(B+6), 516-(B+7), 516-(B+8), 516-(B+9), 516-(B+10), and 516-(B+11) are configured as a second ANN 524-2; a third set of logic blocks 516-C, 516-(C+1), 516-(C+2), and 516-(C+3) are configured as a third ANN 524-3, and a fourth set of logic blocks 516-D, 516-(D+1), 516-(D+2), 516-(D+3), 516-(D+4), 516-(D+5), 516-(D+6), 516-(D+7), and 516-(D+8) are configured as a fourth ANN 524-4. Accordingly, at least four different ANNs are implemented over a plurality of logic blocks 516 of memory device 508. In some embodiments, ANNs can be implemented at a granularity of a single logic block 516 and/or multiple memory devices 508 as well.

Four ANNs 524-1, 524-2, 524-3, and 524-4 (collectively referred to as ANNs 524) can have different topologies (e.g., logical topologies). In some embodiments, respective topologies of the ANNs 524 can correspond to physical topologies of a constituent logic block(s). In an example in which an ANN is implemented over multiple logic blocks, a logical topology of the ANN can correspond to a physical topology of the multiple logic blocks (e.g., each configured as a node of the ANN).

In some embodiments, respective topologies of the ANNs 524 may not correspond to physical topologies of a constituent logic block(s). In this example, a controller (e.g., controller 106 as previously described in connection with FIG. 1) can map (e.g., upon configuring various portions of the memory devices 508 as the ANNs 524) and track a respective topology of each ANNs implemented within the memory devices 508 using a lookup table (e.g., lookup table 111 as previously described in connection with FIG. 1), for instance. The controller can also update the mapping information stored in the lookup table responsive to changes in ANNs 524. The changes in ANNs 524 can include changes of constituent logic blocks of the ANNs 524 and/or addition/deletion of ANNs within the memory devices 508.

Multiple ANNs implemented within memory devices 508 (e.g., memory device 508-1) can be operated independently from each other. Stated differently, multiple ANN operations can be performed concurrently using multiple ANNs implemented within memory devices 508, as described further herein.

Figure 6:
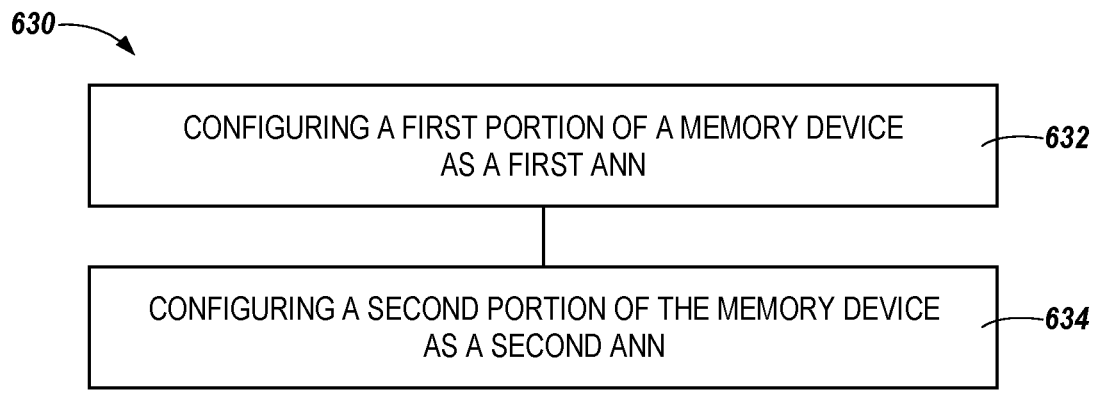
FIG. 6 illustrates an example flow diagram of a method for implementing ANNs in memory in accordance with a number of embodiments of the present disclosure.

FIG. 6 illustrates an example flow diagram of a method 630 for implementing ANNs in memory in accordance with a number of embodiments of the present disclosure. At 632, a first portion of a memory device can be configured as a first ANN. At 634, a second portion of the memory device can be configured as a second ANN. The memory device can be analogous to memory device 108, 308, and/or 508 previously described in connection with FIGS. 1, 3, and 5, respectively. As described herein, the memory device can include a plurality of logic blocks (e.g., logic block 416) and at least one of the first portion and the second portion of the memory device can include a respective one of the plurality of logic blocks.

In one embodiment, an ANN (e.g., either first or second ANN) can be implemented within a single logic block. In another embodiment, an ANN can be implemented over multiple logic blocks and/or multiple memory devices. In some embodiments, constituent logic blocks of the ANN can be modified by configuring a different portion of the memory device as the ANN.

Figure 7:
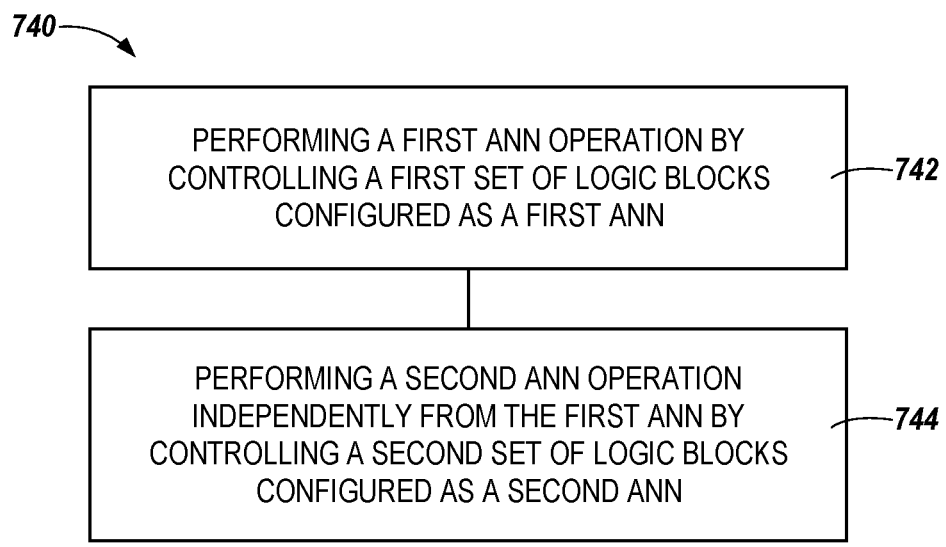
FIG. 7 illustrates an example flow diagram of a method for operating multiple ANNs in memory in accordance with a number of embodiments of the present disclosure.

FIG. 7 illustrates an example flow diagram of a method 740 for operating ANNs in memory in accordance with a number of embodiments of the present disclosure. At 742, a first ANN operation can be performed by controlling a first set of logic blocks configured as a first ANN. At 744, a second ANN operation can be performed independently from the first ANN by controlling a second set of logic blocks configured as a second ANN. In some embodiments, the first set of logic blocks and the second set of logic blocks can be a part of a same memory device (e.g., memory device 108).

Performing an ANN operation (e.g., first and/or second ANN operations) can including passing and/or weighing an input received from an artificial neuron of a previous ANN layer. In one embodiment, the input received at a particular artificial neuron can be passed to another artificial neuron of a next ANN layer as is. In another embodiment, as described in connection with FIG. 2, the received input can be weighed and summed with other inputs prior to providing an output to an artificial neuron of a next ANN layer.

As described herein, the first ANN operation and the second ANN operation can be performed concurrently. In some embodiments, multiple ANN operations being concurrently performed can be associated with a same task and performed based on same inputs. In this example, one of results obtained from performing multiple ANN operations can be selected as a verified result. In some embodiments, the verified result can be a result that is verified by a majority of a plurality of ANNs that have performed the multiple ANN operations.

Figure 8:
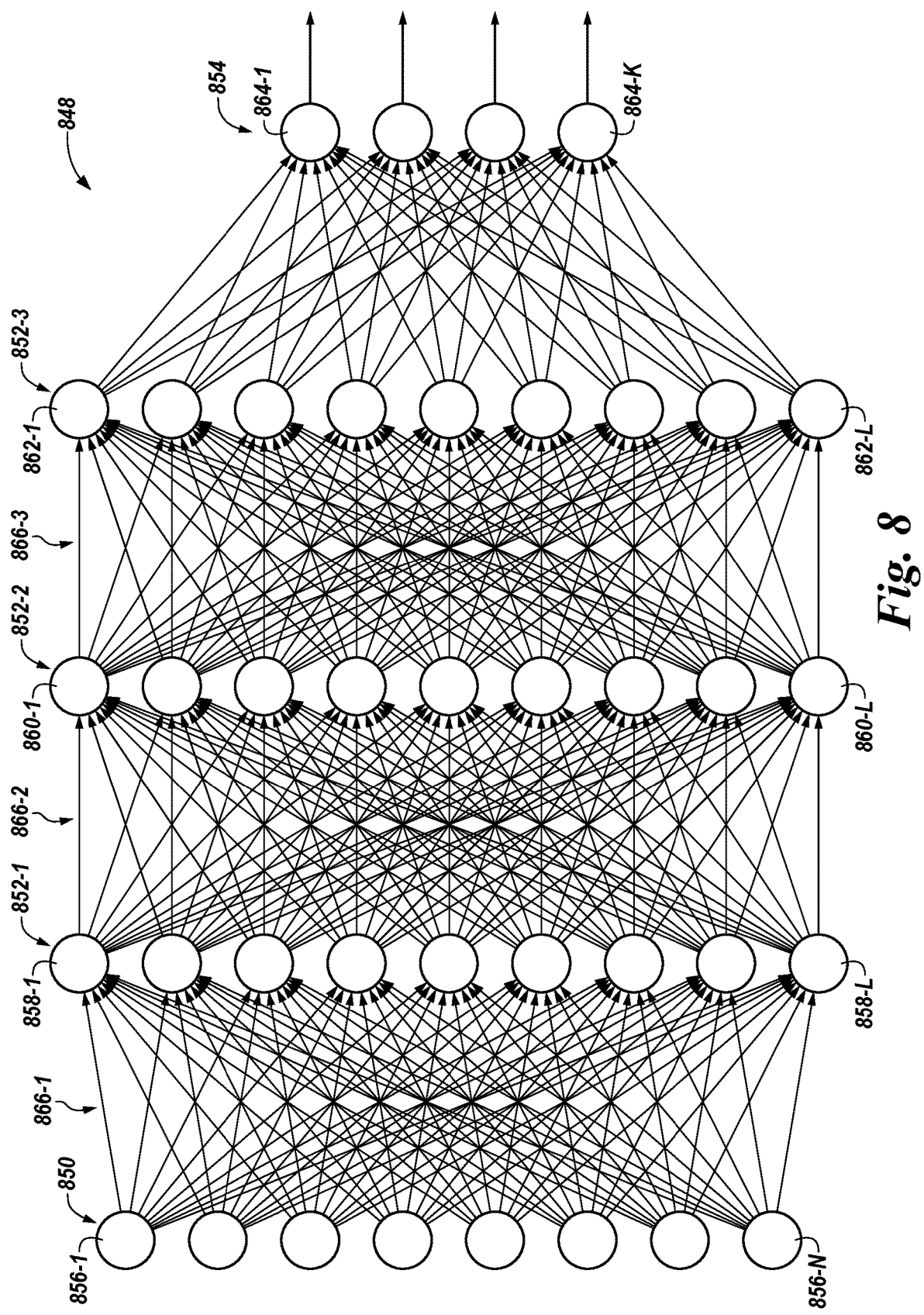
FIG. 8 illustrates an example ANN in accordance with a number of embodiments of the present disclosure.

FIG. 8 illustrates an example model of an ANN 848 in accordance with a number of embodiments of the present invention. ANN 848 can include an ANN layer 850 (e.g., input layer) having nodes 856-1 to 856-N that receive various inputs, such as inputs x1 to xN as previously described in connection with FIG. 2. Nodes of each ANN layer (e.g., ANN layers 850, 852-1, 852-2, 852-3, and 854) can correspond to artificial neurons as described herein.

ANN 848 can include ANN layers 852-1 to 852-3. ANN layer 852-1 can include nodes 858-1 to 858-L. As illustrated in an interconnection region 866-1, each of the respective nodes 858-1 to 858-L can be coupled to receive inputs from nodes 856-1 to 856-N. ANN layer 852-2 can include nodes 860-1 to 860-L. As illustrated in an interconnection region 866-2, each of the respective nodes 860-1 to 860-L can be coupled to receive inputs from nodes 858-1 to 858-L. ANN layer 852-3 can include nodes 862-1 to 862-L. As illustrated in an interconnection region 866-3, each of the respective nodes 862-1 to 862-L can be coupled to receive inputs from nodes 860-1 to 860-L. The ANN 848 may be configured in a training process in which the various connections in the interconnection regions 866 are assigned a weight value or updated with a new weight value that is used for operations or computations at nodes 858, 860, or 862. The training process may be different depending on a particular application or use of the ANN 848. For instance, an ANN may be trained for image recognition, speech recognition, or any number of other processing or computational tasks.

ANN 848 can include an output layer 854 having output nodes 864-1 to 864-K. Each of the respective output nodes 864-1 to 864-K can be coupled to receive inputs from nodes 862-1 to 862-L. The process of receiving usable outputs at output layer 854 and output nodes 864 as a result of inputs fed into nodes 856 at ANN layer 850 may be referred to as inference or forward propagation. That is, input signals representative of some real world phenomena or application may be fed into a trained ANN 848 and through inference that occurs as a result of calculations enabled by various nodes and interconnects, a result may be output. In the case of an ANN 848 trained for speech recognition, the input may be signals representative of human speech in one language, and the output may be signals representative of human speech in a different language. In another case of an ANN 848 trained for image recognition, the input may be signals representative of a photograph and the output may be signals representative of the subject in the photograph.

As described herein, multiple ANNs may be configured within a memory device. The multiple ANNs may be separately trained (either locally or remotely) and the trained ANNs may be used for inference within the memory device. The multiple ANNs may perform the same or different functions. They may have the same or different weights relative to one another.

Figure 9:
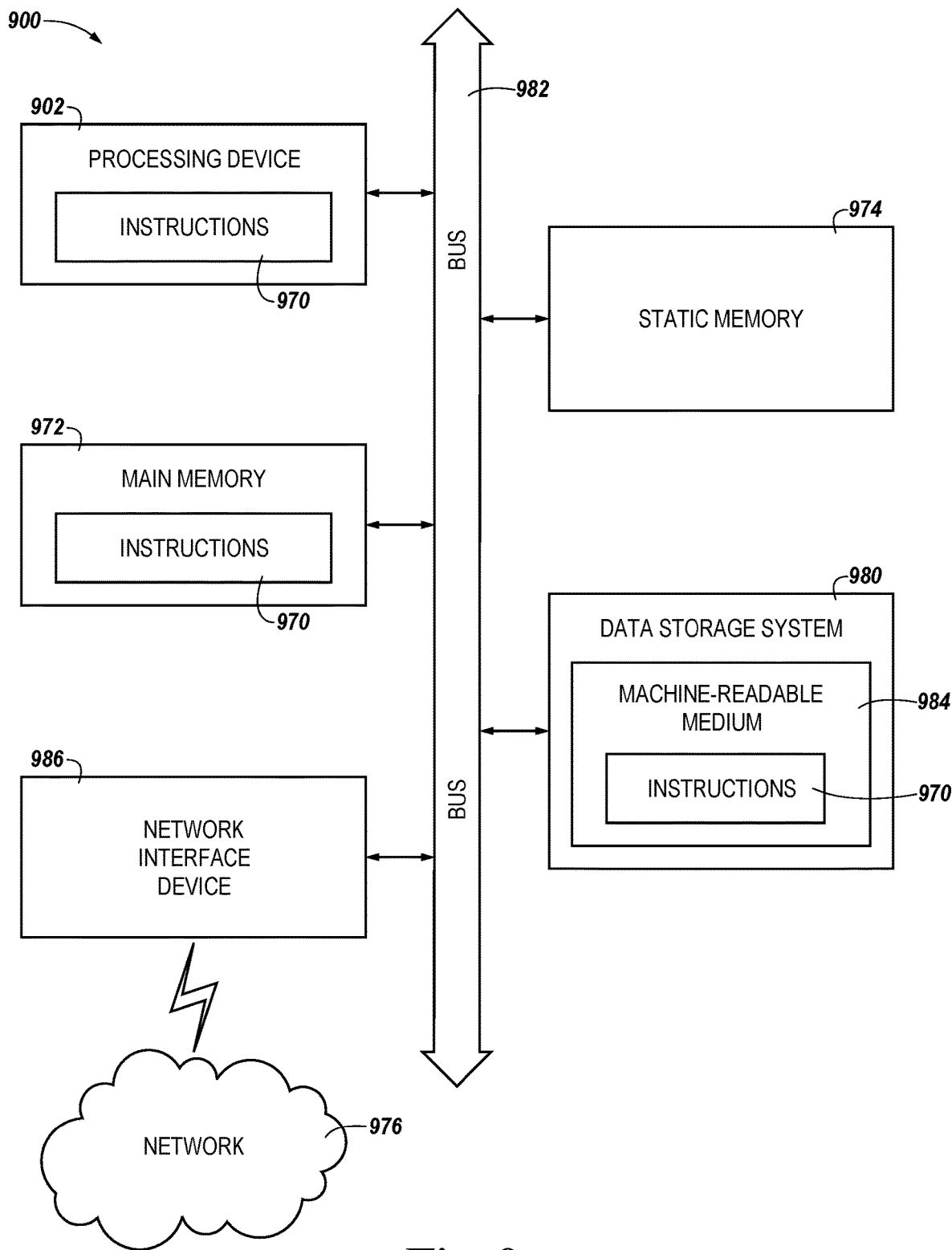
FIG. 9 illustrates an example machine of a computer system within which a set of instructions, for causing the machine to perform various methodologies discussed herein, can be executed.

FIG. 9 illustrates an example machine of a computer system 900 within which a set of instructions, for causing the machine to perform various methodologies discussed herein, can be executed. In various embodiments, the computer system 900 can correspond to a system (e.g., the system 100 of FIG. 1) that includes, is coupled to, or utilizes a memory sub-system (e.g., the memory system 104 of FIG. 1) or can be used to perform the operations of a controller (e.g., the controller 106 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 972 (e.g., read-only memory (ROM), flash memory, dynamic random access memory (DRAM) such as synchronous DRAM (SDRAM) or Rambus DRAM (RDRAM), etc.), a static memory 974 (e.g., flash memory, static random access memory (SRAM), etc.), and a data storage system 980, which communicate with each other via a bus 982.

Processing device 902 represents one or more general-purpose processing devices such as a microprocessor, a central processing unit (CPU), or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 970 for performing the operations and steps discussed herein. The computer system 900 can further include a network interface device 986 to communicate over the network 976.

The data storage system 980 can include a machine-readable storage medium 984 (also known as a computer-readable medium) on which is stored one or more sets of instructions 970 or software embodying any one or more of the methodologies or functions described herein. The instructions 970 can also reside, completely or at least partially, within the main memory 972 and/or within the processing device 902 during execution thereof by the computer system 900, the main memory 972 and the processing device 902 also constituting machine-readable storage media.

In one embodiment, the instructions 970 include instructions to implement functionality corresponding to the host 102 and/or the memory system 104 of FIG. 1. While the machine-readable storage medium 984 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a plurality of logic blocks in complementary metal-oxide-semiconductor (CMOS) under an array of memory cells of a memory device, wherein:
a first portion of the plurality of logic blocks is configured as a first artificial neural network (ANN); and
a second portion of the plurality of logic blocks is configured as a second ANN; and
wherein multiple ANN operations are concurrently performable using the first ANN and the second ANN.

2. The apparatus of claim 1, wherein a particular logic block of the plurality of logic blocks comprises a data bus coupling the particular logic block to a device located external to the memory device.

3. The apparatus of claim 1, wherein at least one of the plurality of logic blocks is a configurable logic block (CLB).

4. The apparatus of claim 1, wherein the plurality of logic blocks of the memory device are configured as more than two ANNs including the first and the second ANNs.

5. The apparatus of claim 1, wherein the memory device comprises a dynamic random access memory (DRAM) memory device.

6. The apparatus of claim 1, wherein a logical topology of at least one of the first ANN and the second ANN is different than a physical topology of the at least one of the first ANN and the second ANN.

7. The apparatus of claim 1, wherein a logical topology of at least one of the first ANN and the second ANN corresponds to a physical topology of the at least one of the first ANN and the second ANN.

8. A method, comprising:
configuring a first portion of a plurality of logic blocks in complimentary metal-oxide-semiconductor (CMOS) under an array of memory cells of a memory device as a first artificial neural network (ANN);
configuring a second portion of the memory device as a second ANN, wherein the first portion and the second portion of the memory device each comprises at least one of the plurality of logic blocks of the memory device; and
performing a first ANN operation using the first ANN concurrently with a second ANN operation using the second ANN.

9. The method of claim 8, wherein at least one of the first ANN and the second ANN comprises a plurality of ANN layers; and
wherein the method further comprises:
receiving an input from an artificial neuron of a previous one of the plurality of ANN layers; and
passing the received input to an artificial neuron of a next one of the plurality of ANN layers.

10. The method of claim 9, further comprising:
weighing a plurality of inputs received from artificial neurons of the previous one of the plurality of ANN layers;
summing the plurality of inputs into an output; and
provide the output to an artificial neuron of the next one of the plurality of ANN layers.

11. The method of claim 8, further comprising:
performing a plurality of ANN operations including the first ANN operation and the second ANN operation concurrently to perform a same task based on a same input; and
selecting a result verified by a majority of results of the plurality of ANN operations.

12. The method of claim 8, further comprising modifying a constituent logic block of the first ANN or the second ANN by configuring a different portion of the memory device as the first ANN or the second ANN.

13. The method of claim 8, further comprising modifying a constituent logic block of the first ANN or the second ANN by reducing constituent logic blocks of the first ANN or the second ANN.

14. The method of claim 8, wherein performing the first and the second ANN operations concurrently comprises executing respective ANN functions comprising at least one of:
a threshold function;
a sign function;
a sigmoid function; and
a linear function.

15. A system, comprising:
a plurality of memory devices, each one of the plurality of memory devices comprises:
a memory array; and
a plurality of logic blocks in complementary metal-oxide-semiconductor (CMOS) under an array of memory cells of a respective one of the plurality of memory devices;
a controller coupled to the plurality of memory devices, the controller configured to:
configure logic blocks distributed over at least two of the plurality of memory devices as a first artificial neural network (ANN); and
configure a portion of logic blocks of the plurality of memory devices as a second ANN.

16. The system of claim 15, wherein at least one logic block of the plurality of memory devices is a fundamental building block of a field programmable gate array (FPGA).

17. The system of claim 16, wherein the logic block as the FPGA is configured to flexibly switch between a central processing unit (CPU) and a graphics processing unit (GPU).

18. The system of claim 15, wherein the controller comprises a lookup table and configured to use the lookup table to track a topology of a plurality of ANNs including the first ANN and the second ANN implemented within the plurality of memory devices.

19. The system of claim 18, wherein the controller is configured to update mapping information stored in the lookup table in response to changes of constituent logic blocks of the first ANN or the second ANN.

20. The system of claim 15, wherein at least one logic block of a first one of the plurality memory devices is coupled to a different logic block of a second one of the plurality of memory devices.

* * * * *